United States Patent [19]

Miyamoto

[11] Patent Number: 4,710,699

[45] Date of Patent: Dec. 1, 1987

[54] ELECTRONIC SWITCHING DEVICE

[75] Inventor: Kiyoshi Miyamoto, Otsu, Japan

[73] Assignee: Omron Tateisi Electronics Co., Kyoto, Japan

[21] Appl. No.: 660,675

[22] Filed: Oct. 15, 1984

[30] Foreign Application Priority Data

Oct. 14, 1983 [JP] Japan ................... 58-192923
Oct. 14, 1983 [JP] Japan ................... 58-192924
Jan. 18, 1984 [JP] Japan ................... 59-6440
Jan. 18, 1984 [JP] Japan ................... 59-6442

[51] Int. Cl.$^4$ ................... H03K 17/78; H02H 9/02
[52] U.S. Cl. ................... 323/324; 323/246; 323/325; 361/93
[58] Field of Search ........... 323/237, 238, 239, 246, 323/276, 277, 320, 321, 324, 325; 361/93, 100, 101, 57, 87

[56] References Cited

U.S. PATENT DOCUMENTS 3,879,652  4/1975  Billings ................... 323/325 X
4,271,448  6/1981  Pond ................... 323/246 X

FOREIGN PATENT DOCUMENTS 0047129  4/1981  Japan ................... 323/324

Primary Examiner—Peter S. Wong
Attorney, Agent, or Firm—Wegner & Bretschneider

[57] ABSTRACT

An electronic switching device having a detection circuit or input circuit powered by an external source and load is described. The external source and load are in a series circuit with a power switching element which thereby provides switch controlled power in response to an output signal generated from a detection circuit. A current limiting device is connected in series with the power switching element, and an excess current detection circuit responds to excessive current flowing in the aforemention series circuit to interrupt the power switching element when an abnormally large current is passed. Circuitry is provided for holding the current limiting device in its operable or current interrupting state for a predetermined period of time.

7 Claims, 11 Drawing Figures

ELECTRONIC SWITCHING DEVICE

BACKGROUND OF THE INVENTION

This invention relates to an electronic switching device, such as a photo electronic switch, proximity switch or the like, which is so constructed to directly control a load connected thereto in response to an output signal generated by a detecting circuit thereof, and more particularly to an improved electronic switching device protected from any short-circuit across output terminals of the switching device.

There is well known an electronic switching device, such as a photoelectronic switch, a proximitly switch or the like, having such a construction that a switching element, e.g., thyristor or the like, is actuated by an output signal generated from a detecting circuit so as to control a power supply to an external load connected to the switching device. The conventional switching device, however, has the disadvantage that if the connected load accidentally becomes internal short or the switching device is erroneously directly connected to a power source without connecting any load in series, the switching element would be destroyed or exploded by a excessive over current flowing through the switching element on closing the same, damaging neighbor things or human body.

It is, therefore, a primary object of this invention to provide an electronic switching device including an improved protection circuit, which can directly control an external load connected thereto.

It is a further object of this invention to provide an electronic switching device which is easy and safe to be connected with the external load.

It is a still further object of this invention to provide an electronic switching device which is automatically reset to its original normal operation if a short-circuit condition is resolved after the short-circuit condition causes the switching device to be inactive.

It is another object of this invention to provide an electronic switching device having a display for indicating a normal or short-circuit condition.

According to this invention, there is provided an electronic switching device including a detection circuit or input means, a power switching element for providing a load with a switching controlled power in response to an output signal generated from the detection circuit, a current limiting means connected with the power switching element in series, and short detecting means connected with the power switching element for providing the current limiting means with a stop signal by detecting a short-circuit condition of the load.

Other objects and advantages of this invention with be apparent upon reference to the following description in conjunction with the accompanying drawings, in which:

DETAILED DESCRIPTION

Figure 1:
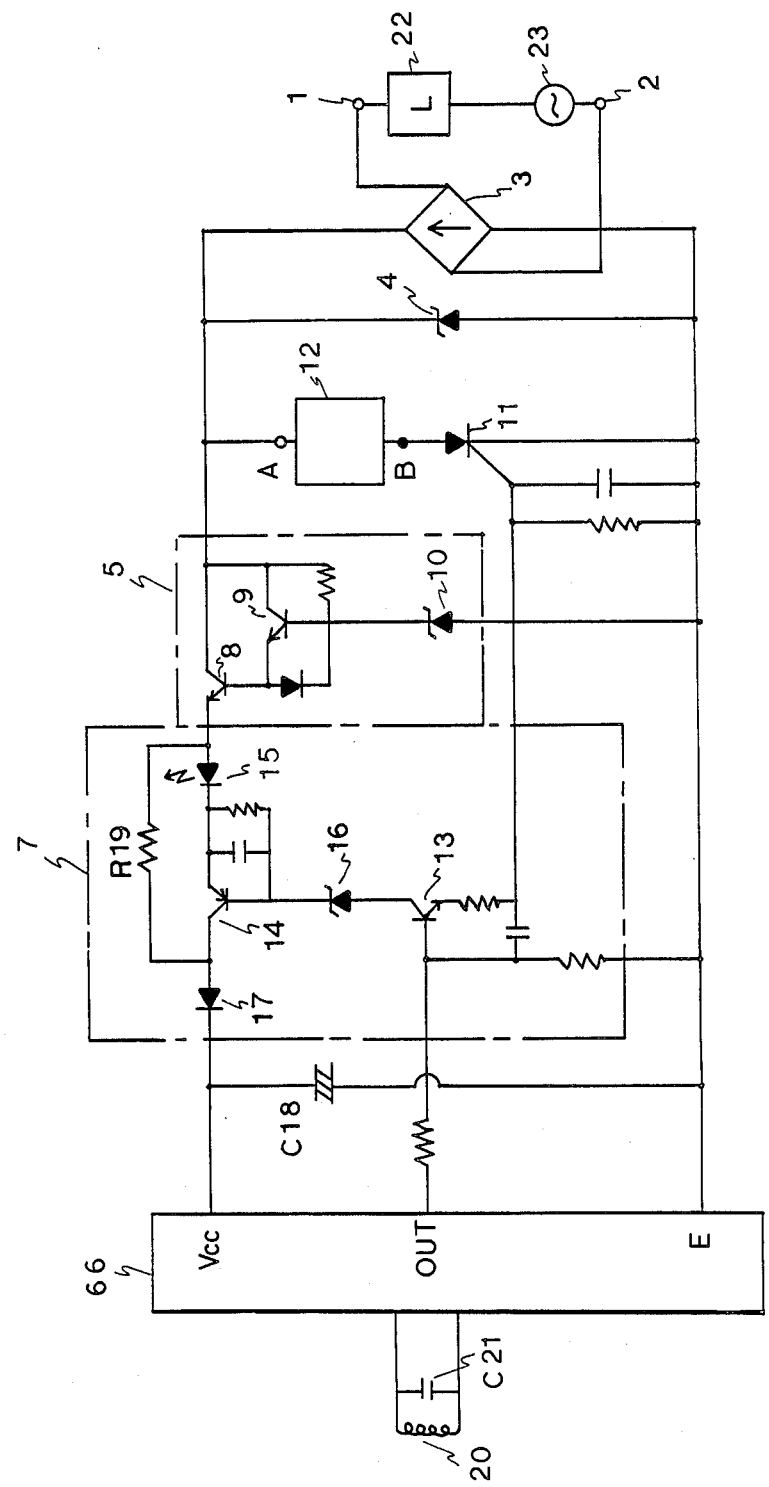
FIG. 1 is a schematic circuit diagram of an electronic switching device adapted to be connected with a power source and a load, as a preferred embodiment of this invention.

Referring, now, to FIG. 1, there is shown a schematic circuit diagram of an electronic switching device which may be used as an a.c. two-wire type proximity switch, as a preferred embodiment of this invention. The switching device is connected with an external load 22 and an a.c. power source 23 in series through a pair of output terminals 1 and 2 which are connected with a diode bridge 3. Across positive-and-negative terminals of the bridge there are connected a Zener diode 4 for absorbing a surge voltage, a voltage regulator 5, and a switching circuit section. The voltage regulator circuit 5 includes a pair of Darlington connection transistors 8 and 9, and a Zener diode 10 for keeping a base voltage of the transistors constant. An integrated-circuit type detection circuit 6 constituting a detection section or input means with a resonance circuit consisting of a detection coil 20 and a capacitor 21 is supplied with a constant voltage by the voltage regulation circuit 5 through a trigger circuit 7. In the above-mentioned switching circuit section there are connected a thyristor 11 for switching the load 22 and a protection circuit 12 in series. The trigger circuit 7 includes a transistor 13 which amplifies an output current from the detection circuit 6 to apply a gate signal to the thyristor 11, and a transistor 14 which provides the detection circuit 6 with the constant voltage. A light emitting diode 15 for a operation display is connected between an emitter of the transistor 14 and the voltage regulator circuit 5. A base of the transistor 14 is connected to a collector of the transistor 13 through a Zener diode 16. A collector of the transistor 14 is connected to a power input terminal Vcc of the detection circuit 6 through a diode 17. A capacitor C18 is connected across the power input terminals of the detection circuit 6 for smoothing and power supply. A by-pass resistor R19 is connected between the collector and emitter of the transistor 14 for supplying the detection circuit 6 with a predetermined power in a stand by mode of the electronic switching device.

Figure 2:
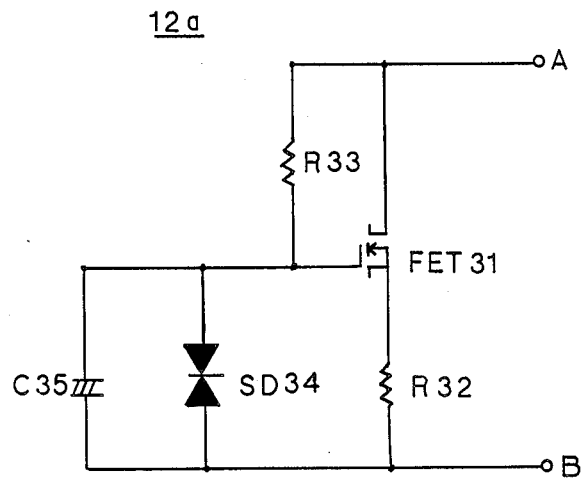
FIG. 2 is a circuit diagram of a two-terminal type short protection circuit which may be employed in the switching device of FIG. 1.

FIG. 2 illustrates a two-terminal type short protection circuit 12a which may be employed in the protection circuit 12 of FIG. 1. Between terminals A and B are connected a current limiting transistor FET31 and an overcurrent detection resistor R32 in series. The transistor FET31 is represented by a power field effect transistor (power MOS FET) in this embodiment. A gate of the transistor FET31 is connected to the terminal A through a bias resistor R33, and to the terminal B through a switching diode SD34 and a capacitor C35. The diode SD34 is adapted to be turned-on above a predetermined voltage, and the capacitor C35 is disposed to supply the diode SD 34 with a holding current during a predetermined time period.

When the electronic switching device of FIG. 1 employing the protection circuit 12a of FIG. 2 is connected with the series-connected load 22 and a.c. source 23, a small current flows through the load 22, whereby an a.c. voltage is rectified by the diode bridge 3, regulated to a predetermined d.c. voltage by the voltage regulator circuit 5, and supplied to the detection circuit 6 and the capacitor C18 to be charged through the resistor R19 and the diode 17. Then, an oscillator of the detection circuit 6 connected with the resonance circuit of coil 20 and capacitor C18 oscillates, so that the switching device becomes a stand by mode for detecting an object to be detected. In this mode, the thyristor is OFF, and the transistor FET 31 of the short protection circuit 12a is ON since a bias potential is applied to the gate of the transistor FET 31 through the resistor R33.

If the oscillation of the oscillator is changed in response to approach by a moving object, the detection circuit 6 develops an output signal to turn on the transistor 13 and trigger the thyristor 11, so that the thyristor 11 is turned-on and a load current flows through the diode bridge 3 and the load 22 to drive the load. Whenever a zero-cross point passes in the subsequent cycles, the thyristor 11 is turned-off but the transistors 13 and 14 are so turned-on to rapidly charge the capacitor C18. When the charged voltage in the capacitor reaches the Zener voltage of the diode 16, the transistor 14 is turned-off and the thyristor 11 is turned-on. Thus, the detection circuit 6 is supplied with a power and the thyristor 11 is controlled on a phase-control basis. In the respective zero-cross points, the capacitor C18 is rapidly charged energizing the light emitting diode 15. The diode repeats light-on and -off at a twice rate of a commercial, a.c. frequency but seems to be continuously lighted-on to maked eyes, so that a detecting mode representing that the proximity switching device detects an object is displayed by the LED 15.

If an over current flows in the load 22 or the load 22 makes a short-circuit, a large current flows through the short-circuit protection circuit 12a and the thyristor 11, so that a voltage across the resistor R32 exceeds a predetermined value, the switching diode SD34 is turned-on, and the gate voltage of the transistor FET31 drops. Then, the transistor FET31 is turned-off, a short-circuit through the diode bridge 3 and the thyristor 11 is cut off. When a zero cross point comes after the end of the half cycle of the a.c. source, the voltage developed across the diode S34 of the circuit 12a becomes lower than a predetermined value but the diode S34 remains ON because it is supplied with a holding current. The transistor FET31 is turned-on only after the capacitor C35 has been charged through the resistor R33, and the timing of the turning-on of the transistor FET31 is delayed by a CR time constant. Accordingly, if the CR time constant is designed to be large, the transistor FET31 remains OFF in the next half cycle and any short-circuit current does not flow through the thyristor, the diode bridge 3 nor the load 22, so that the respective circuit components are protected.

The electronic switching device in this embodiment represents a two-wire a.c. proximity switch, but may be modified to represent a photoelectronic proximity switch or other electronic switch. It should be understood that the protection circuit in the embodiment may be used in other electronic switching device than that of FIG. 1. If the device of FIG. 1 is necessary to be connected with a d.c. power source instead of the a.c. source 23, the voltage across the terminals A and B in FIG. 2 remains constant and the diode SD34 remains ON, so that the holding current capacitor C35 may be omitted. Through the current limiting element of this embodiment is represented by the FET transistor FET31, it may be represented by a power transistors in Darlington connection with a high hfe. The switching diode SD34 of FIG. 2 may be composed of a thyristor and a Zener diode which are constructed in a hybrid type, or other two-terminal elements, e.g., which termon in a predetermined voltage.

Figure 3:
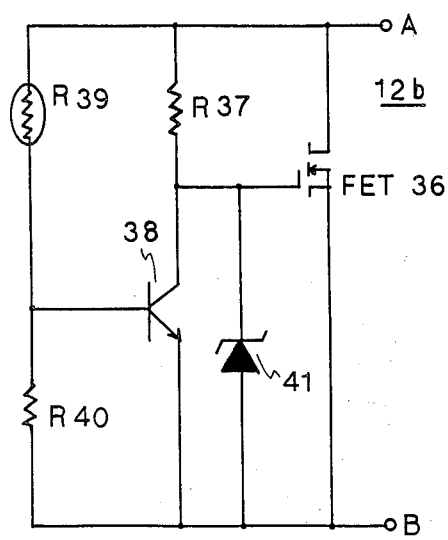
FIG. 3 is a circuit diagram of another two-terminal type short protection circuit which may be employed in the switching device of FIG. 1.

In FIG. 3 there is shown another two terminal type of short protection circuit 12b which may be employed in the circuit 12 of the device in FIG. 1. The short-circuit 12 of the device in FIG. 1. The short-circuit protection circuit 12b include a power field effect transistor FET36 as a current limiting element, resistors 37, 39 and 40, and a transistor 38. Farther, a Zener diode 41 is interposed between a gate of the transistor FET36 connected with a collector of the transistor 38 and the terminal B for protecting the gate of the transistor FET36. The resistor R39 and R40 develop a bias voltage to the transistor 38. The resistor R39 is a negative characteristic resistor or thermistor which has a variable resistance suddenly dropping at a predetermined temperature as illustrated in a curve of FIG. 4. The thermistor R39 and the transistor FET36 are mechanically or thermotically contacted each other which may be constructed in a hybrid IC constituting the circuit 126. The protection circuit 12b and the thyristor 11 connected in series provides the switching circuit section of the device of FIG. 1.

Figure 4:
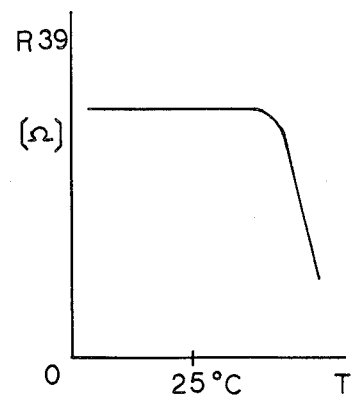
FIG. 4 illustrates a curve of temperature characteristics of a temperature responsive resistor employed in the two-terminal type short protection circuit of FIG. 3.

When a large current (abnormal current) flows through the protection circuit 12b and the thyristor 11 due to a short circuit in the load 22 or a load overcurrent, the voltage between the terminals A and B becomes abnormally large, so that the base voltage of the transistor 38 rises. When the large current through the protection circuit 12b becomes above a predetermined value, the transistor 38 is turned-on and the gate voltage of the transistor FET36 is decreased, so that the transistor FET36 becomes OFF and the short-circuit or large current through the diode bridge 3 and the thyristor 11 is cut off or interrupted. Simultaneously, the transistor FET36 flowed by the large current generates a heat to be conducted to the thermistor R39. When the thermistor R39 reaches a predetermined temperature, the resistance threof decreases as illustrated in FIG. 4 to raise the base voltage of the transistor 38. Thus, even if the voltage between the terminals A and B drops to a small value, the transistor 38 remains to be liable to be ON, turning off the transistor FET 36. Accordingly, the current flowing through the transistor FET 36 is remarkably reduced, and the transistor is protected from destruction or explosion. The protection circuit 12b may be modified in such a circuit that the resistor R40 is replaced with a positive characteristic thermistor thermally connected with transistor FET36 and the thermistor R39 is replaced with a constant value resistor. The modified circuit also has the same effect as that of FIG. 3.

Figure 5:
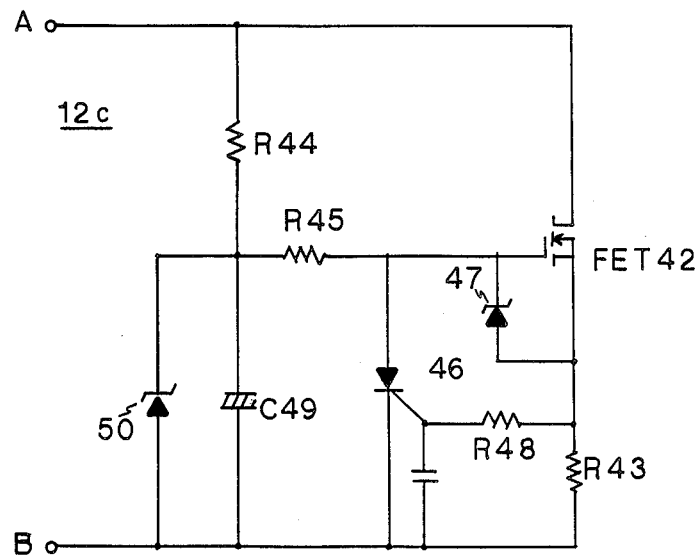
FIG. 5 is a circuit diagram of still another two-terminal type short protection circuit which may be employed in the switching device of FIG. 1.

FIG. 5 shows still another two terminal type of protection circuit 12c, which may be employed as the protection circuit 12 of FIG. 1. The protection circuit 12c of FIG. 5 includes a current limiting transistor FET42 and an overcurrent detection resistor R43 which are connected in series with each other like the circuit of FIG. 2. Biasing resistors R44 and R45 are connected between a drain and a gate of the transistor FET42, and a thyristor 46 for switching the transistor FET 42 is connected between the gate and the terminal B. A protection Zener diode 47 is disposed between the gate and source of the transistor FET42. A gate of the thyristor 46 is connected with the detection resistor R43 through a resistor R48. Between a common connection of the resistors R44 and R45 and the terminal B, there are connected a capacitor C49 for providing the thyristor 46 with a holding current and a protection Zener diode 50 in parallel.

When an abnormal large current flows through the protection circuit 12c and the thyristor 11 in FIG. 1 by a short-circuit in the like, the voltage across the resistor R43 becomes larger than a predetermined value to trigger the thyristor 46 through the resistor R48 so as to tern-on the thyristor 46. The thyristor 46 is so designed to be turned-on below a predetermined voltage between the gate and the source of the transistor FET42 which is defined by the Zener diode 50. Accordingly, if the thyristor 46 is turned-on, the gate voltage of the transistor FET42 is so decreased to turn-off the transistor FET42 and cut off the short-circuit or abnormal large current through the diode bridge 3 and the thyristor 11. When a zero cross point comes after the end of a half cycle of the a.c. source, a current through the thyristor 46 is decreased while the thyristor 46 remains ON because it is supplied with a holding current by the charge capacitor C49. While the protection circuit 12c is in operation and the transistor FET42 is OFF, a current flows through the resistors R44 and R45 and the thyristor 46 to the voltage regulator circuit 5 (FIG. 1) so as to provide the detection circuit 6 with a power. The current consumed by the circuit 6 holds the thyristor 46, and again charges the capacitor C49. Thus, the thyristor 46 is kept ON by a discharged current from the capacitor C49 in the respective zero cross points and by the current consume by the circuit 6 after the zero cross points, whereby the transistor FET42 is continued to be OFF. Thus, the respective circuit components, the load 22, the diode bridge 3 and the thyristor 11, are protected. When the device of FIG. 1 is modified to a d.c. source type switching device, a holding current continues to flow through the resistors R44 and R45 and the thyristor 46 until the transistor FET42 is turned-on by disconnecting the d.c. source, so that the capacitor C49 may be omitted.

Figure 6:
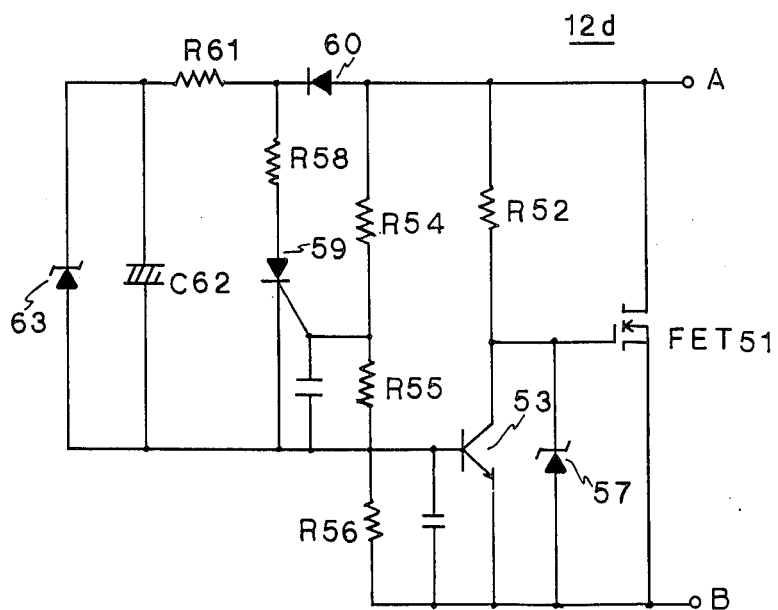
FIG. 6 is a circuit diagram of still further another two-terminal type short protection circuit which may be employed in the switching device of FIG. 1.

Referring to FIG. 6, there is shown a modified two-terminal type short protection circuit 12d based on the circuit 12b of FIG. 3. Between terminals A and B, there are connected in parallel a power FET transistor FET51 and a series circuit of a resistor R52 and a transistor 53. A high speed switching transistor is employed as the transistor 53 for quickly cutting off the transistor FET51 in a short-circuit condition. Resistor R54, R55 and R56 form a bias circuit for the transistor 53 at a base thereof. Across the resistors R54 and R55, there is connected a series circuit of a resistor R58 and a thyristor 59 through a diode 60. The thyristor 59 is adapted to be turned-on when a current through the resistor R55 becomes above a predetermined value. A resistor 61 has a relatively low resistance value to rapidly charge a capacitor C62 for supplying the thyristor 59 with a holding current in a zero cross point of the voltage between the terminals A and B. The capacitor C62 is connected with a Zener diode 63.

When an abnormal large current flows through the protection circuit 12d and the thyristor 11 due to a short-circuit in the load 22 or the like, a voltage across the source and the drain of the transistor FET51 is increased and the base voltage of the transistor 53 is also increased by the resistors 54, 55 and 56. When the abnormal large current becomes above a predetermined value, the transistor 53 is immediately turned-on and the transistor FET51 is turned-off by the decrease of the gate voltage of the transistor FET51. Thus, any short-circuit current through the diode bridge 3 and the thyristor 11 is cut off.

Unless there was the thyristor 59, the transistor 53 would be turned-off at a zero cross point in a changing voltage value between terminals A and B, and the transistor FET51 would be continued to be turned-on until the transistor FET51 is turned-off by the transistor 53 again turned-on by a short-circuit current starting after the zero cross point. That is, the transistor FET51 would be continually flowed by a relatively large current for each half cycle of the a.c. source bringing an over-heat in the transistor FET51 which is dangerous to be broken or destroyed. Therefore, the circuit 12d of FIG. 6 is so designed that the thyristor 59 is turned-on when the voltage across the resistor R55 becomes above a predetermined value, wherein the base voltage of the transistor 53 is defined by the resistor R54, R55 and R58 and is increased. The time duration when the transistor 53 is OFF is limited to the zero cross point and shortened. Moreover, even if the voltage between the terminals A and B becomes zero around a zero cross point, the thyristor 59 is supplied with a discharged current from the capacitor C62 through the resistors R61 and R58 to be kept ON, in which the resistor R58 has a relatively high resistance value to pass the holding current for a certain time period. The base bias resistance of the transistor 53 in the subsequent half cycle after a short-circuit becomes shorter than the former one, so that the transistor 53 is turned-on by a small increase of the voltage between the terminals A and B and the transistor FET51 is turned-off. Thus, the current through the transistor FET51 is extremely reduced and the heating is also reduced.

Figure 7:
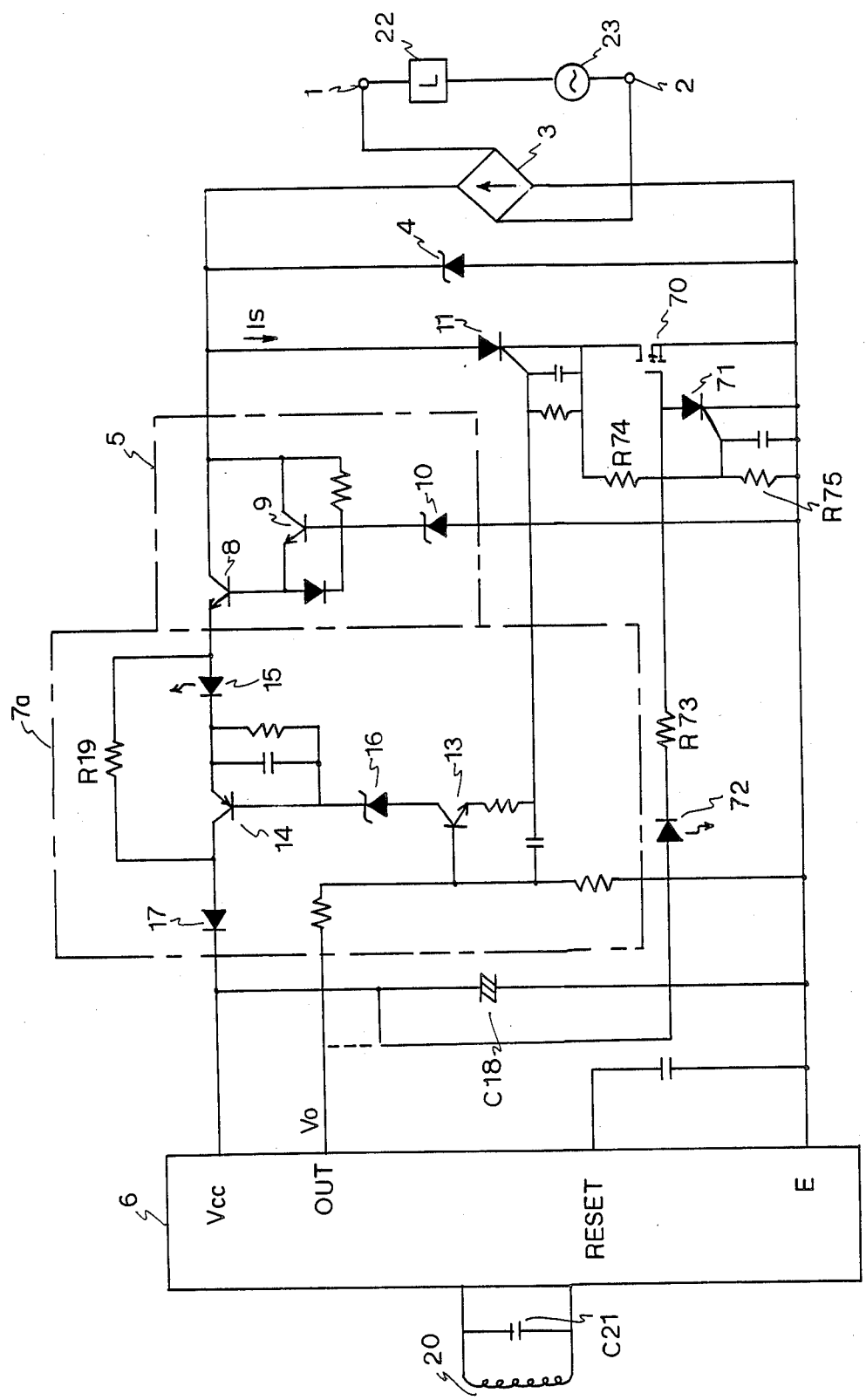
FIG. 7 is a schematic circuit diagram of an electronic switching device as another embodiment of this invention.

Referring to FIG. 7, there is shown a schematic circuit diagram of an electronic switching device, as another embodiment of this invention, which employs a three terminal type protection circuit. The same circuit components of the device in FIG. 7 as those in FIG. 1 are represented with the same reference numerals as those in FIG. 1. A current limiting transistor 70 is connected between a cathode of thyristor 11 and an earth, and employs a power filed effect transistor (power MOS FET) in this embodiment. A thyristor 71 is connected across the gate and the source of the transistor 70 in order to turn off the transistor in a short-circuit condition. One terminal of capacitor C18 supplying detection circuit 6 with a power is connected to the anode of the thyristor 71 through a light emitting diode 72 and a resistor R73. The thyristor 71 at its gate is connected with a voltage dividing circuit consisting of resistors R74 and R75 which is interposed between the cathode of the switching thyristor 11 and a negative terminal of the diode bridge 3. The light emitting diode 72 is disposed to indicate a short-circuit condition wherein the protection circuit is in operation, and is selected to be different color from the operation display light emitting diode 15. The diodes 15 and 72 may be assembled in a single chip, if desired.

When terminals 1 and 2 of the device in FIG. 7 is connected with its external load 22 and a.c. source 23, a rectified constant voltage is supplied to the detection circuit 6 through diode bridge 3, voltage regulator circuit 5 and trigger circuit 7a, as well as disclosed in the above-mentioned embodiments. As the detection circuit 6 detects the approach of an object to be detected by the device, it generate an output signal to drive the thyristor 11 through the transistor 13, while the transistor 70 is ON since the gate of the transistor 70 is supplied with a voltage through the resistor 73. Thus, when the thyristor 11 is turned-on, the load 22 is driven by a load current through the diode bridge 3, the thyristor 11 and the transistor 70. As disclosed in the above-mentioned embodiments, in the subsequent cycles of the a.c. power source, the capacitor C18 is rapidly charged, the transistor 14 is turned-off, and the thyristor 11 is turned-on. The transistor 70 continues to be ON, but since the input impedance of the gate thereof the remains to be high, the current through the resistor 73 and the diode 72 is too small to activate the diode 7s, while the diode 15 is continually so energized to display an operation mode of the device detecting the object.

when an over current flows through the load 22 or the load 22 makes a short-circuit, an abnormal large current or short current flows through the thyristor 11 and the transistor 70. Since a source voltage supplied to the detection circuit 6 is regulated to a constant value by the voltage regulator 5, however, the gate voltage of the transistor 70 is constant and the short current is rendered to a constant value according to a constant current characteristics of the transistor 70. Immediately after then, a gate voltage is applied by the resistors R74 and R75 to the thyristor 71 to be turned-on, so that the gate voltage of the transistor 70 is rendered to about zero. Then, the transistor 70 is turned-off so as to protect the diode bridge 3 and the thyristor 11. After then, the capacitor C18 provides the thyristor 71 with a holding current through the diode 72 and and the resistor R73 so that the diode 72 is activated to display a short protection mode. Thus, since the thyristor 11 and the transistor 70 are not flowed by any short-circuit current after the thyristor 71 is activated by such a short-circuit current, the respective circuit components are protected.

Figure 8:
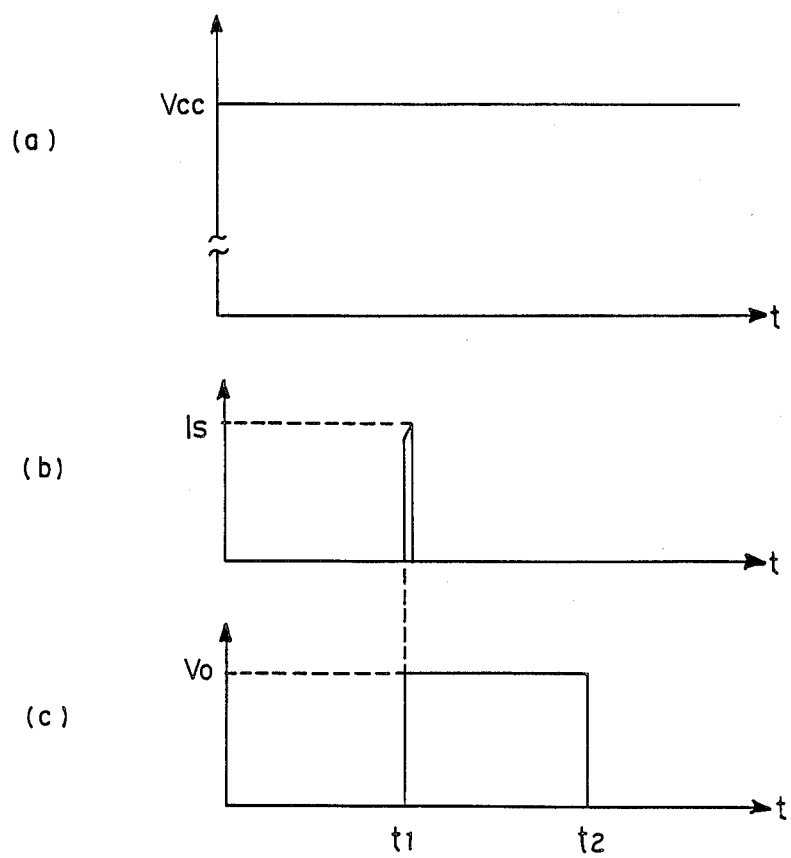
FIG. 8 illustrates waveforms developed at several points of a modified device of FIG. 7.

The terminal of the light emitting diode 72 connected to the power input terminal Vcc of the circuit 6 may be modified to be connected to the output terminal Out of the circuit 6 as shown in a broken line in FIG. 7, and the modified electronic switching device has substantially same operations as those of the device of FIG. 7. The operations of the modified switching device will be discribed in conjunction with FIGS. 7 and 8. FIG. 8 shows a voltage Vcc at the power input terminal Vcc of the circuit 6 (FIG. 8(a)), a short current Is flowing through the thyristor 11 (FIG. 8(b)), and an output signal $V_0$ at the output terminal Out (FIG. 8(c)). When it is assumed that the load 22 is in a short-circuit and the detection circuit 6 detects an object at a timing $t_1$, the circuit 6 generates the output signal $V_0$ (FIG. 8(c)) and a large short current Is (FIG. 8(b)) flows through the thyristor 11 and the transistor 70. According to the same operations as those of the original device of FIG. 7, the transistor 70 is instantly turned-off, so that the short current Is immediately disappears. After then, the output signal $V_0$ of the circuit 6 continues to supply the thyristor 71 with a holding current so as to hold the thyristor 71 ON. As illustrated in FIG. 8(c), if the short-circuit condition is removed and the object moves out of the detection field by the detection circuit 6 at a time point $t_2$, the output signal from the circuit 6 returns to a low level and stops the holding of the thyristor 71. Thus, the modified electronic switching device automatically returns to its original stand-by-mode. When the circuit 6 again generates an output in response to on object approaching, the thyristor 11 and the transistor 70 are triggered and the load 22 is normally driven. The light limiting diode 72 may be omitted, if desired. Thus, according to this modified electronic switching device, the device is outmatically reset to its original mode without disconnecting the power source if the short-circuit condition disappears.

Figure 9:
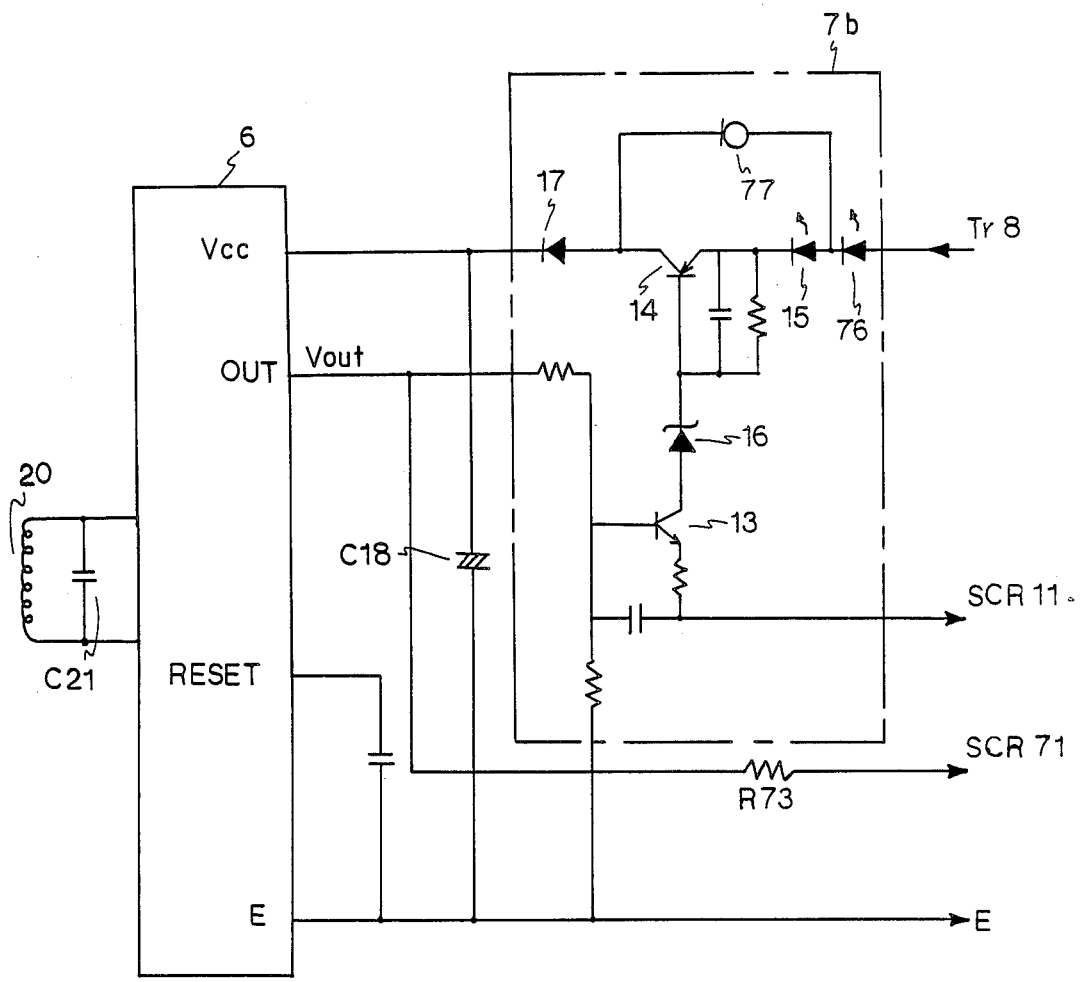
FIG. 9 is a circuit diagram of a main portion of an electronic switching device as still another embodiment of this invention.

FIG. 9 shows a detection circuit 6 and a trigger circuit 76 of an electronic switching device as still another embodiment of this invention. Its remained circuit section of FIG. 9 is the same as that of FIG. 7, and omitted from the drawing of FIG. 9 for simplified explanation. The trigger circuit 76 of this embodiment includes light emitting diode 76 for a power display, light emitting diode 15 for an operation display, and transistor 14 which are connected to the output terminal of voltage regulator circuit including transistor 8 (Tr8). A constant current diode 77 connected between the cathode of the diode 76 and the collector of the transistor 14 is so disposed to, when the transistor 13 is turned-off, prevent the capacitor C18 from being charged with a rush current, whereby the capacitor is constantly charged and the circuit 6 is supplied with a certain power. In this embodiment, a short mode display light emitting diode is omitted and the output terminal is directly connected with resistor 73. The remaining components are the same as those of the device of FIG. 7.

Figure 10:
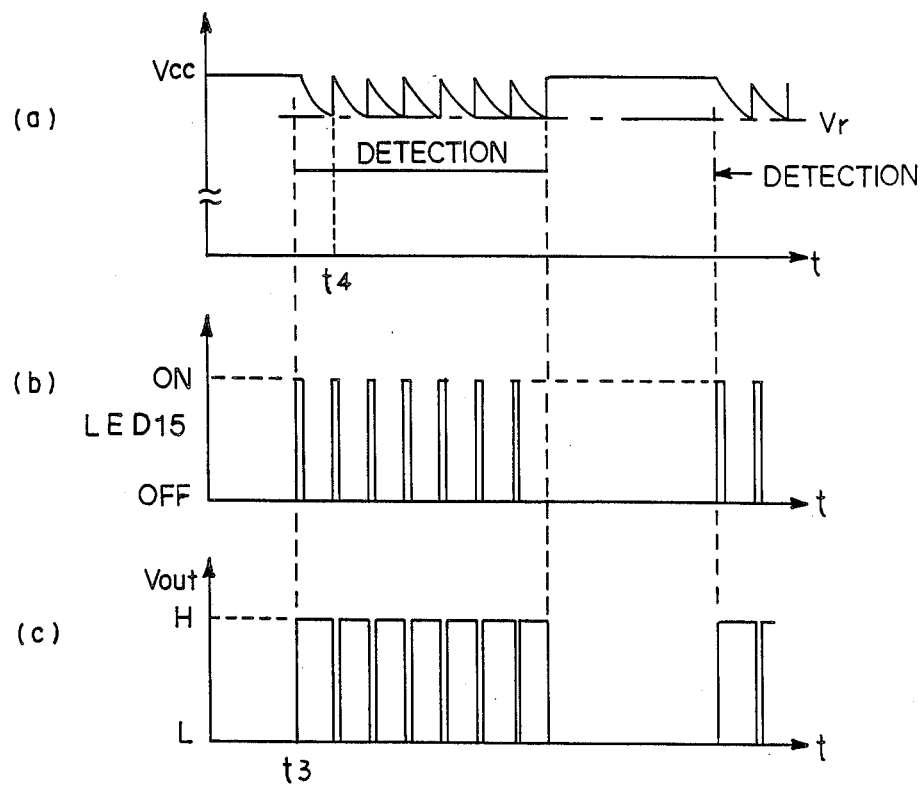
FIG. 10 illustrates waveforms developed at several points of the device of FIG. 9.

As the terminals 1 and 2 are connected with the load 22 and the a.c. power source 23 (see FIG. 7), a power is supplied from the voltage regulator circuit 5 to the detection circuit 6 through the diodes 76, 77 and 17, charging the capacitor C18. Then, the diode 76 is lighted on so as to display a power supply connection. When the circuit 6 detects the approach of an object, the thyristor 11 (SCR11) is triggered to drive the load 22 as disclosed in the embodiment in FIG. 7. When an overcurrent flows in the load 22 or the load 22 makes a short-circuit, the thyristor 71 (SCR71) is turned-off and the transistor 70 (see FIG. 7), so that such a short current is stopped. FIG. 10 shows wave-farms of a source voltage Vcc of the circuit 6, a current of the diode 15, and an output signal $V_{out}$ of the circuit 6, in which the load 22 is in a short-circuit condition and an object enters at a time point $t_3$ within a detection field by the detection circuit 6. The resistor R73 is so designed that a charging current flowing through the diodes 76 and 77 is larger than a holding current to the thyristor SCR71. Accordingly, when the circuit 6 detects the object at the time point $t_3$, the source voltage Vcc threreof is gradually reduced to a reset voltage Vr of the circuit 6 at a time point $t_4$ as illustrated in FIG. 10(a). When the source voltage Vcc reaches the reset voltage Vr, the circuit 6 generates a low signal "L", and the thyristor 71 is turned-off because the holding current is disappeared. Then, the current consumed by the capacitor C18 is reduced to small, the capacitor is charged through the diode 77, and the voltage Vcc again rises. WHen the voltage Vcc becomes larger than the reset voltage Vr, the output signal $V_{out}$ of the circuit 6 again becomes high "H" and the transistor 13 is turned-on. Thus, the capacitor C18 is rapidly charged through the transistor 14, and the light emitting diode 15 is instantly lighted on as illustrated in FIG. 10(b). When this switching device detects the object, the transistor 14, the thyristor 71 and the transistor 70 are turned-off so as to cut the short current. After then, a holding current is applied from the output terminal Out to the thyristor 71 through the resistor R73, while the capacitor C18 is charged through the diodes 76 and 77, and the above-mentioned operations are repeated. As shown in FIG. 10(a), the source voltage Vcc of the circuit 6 repeats a drop-and-rise operation at a predetermined cycle, so that the light emitting diode 15 flickers as illustrated in FIG. 10(b). If by adjusting a resistance value of the resistor R73 the cycle is designed to be about 1.5 seconds, an operator of this device can find that the protection circuit is in operation. If the above-mentioned short-circuit condition is resolved, the thyristor 71 is not triggered by a load current flowing through the thyristor 11 and the transistor 70. Thus, this device automatically returns to its normal mode. The diode 76 may be omitted, if desired.

Figure 11:
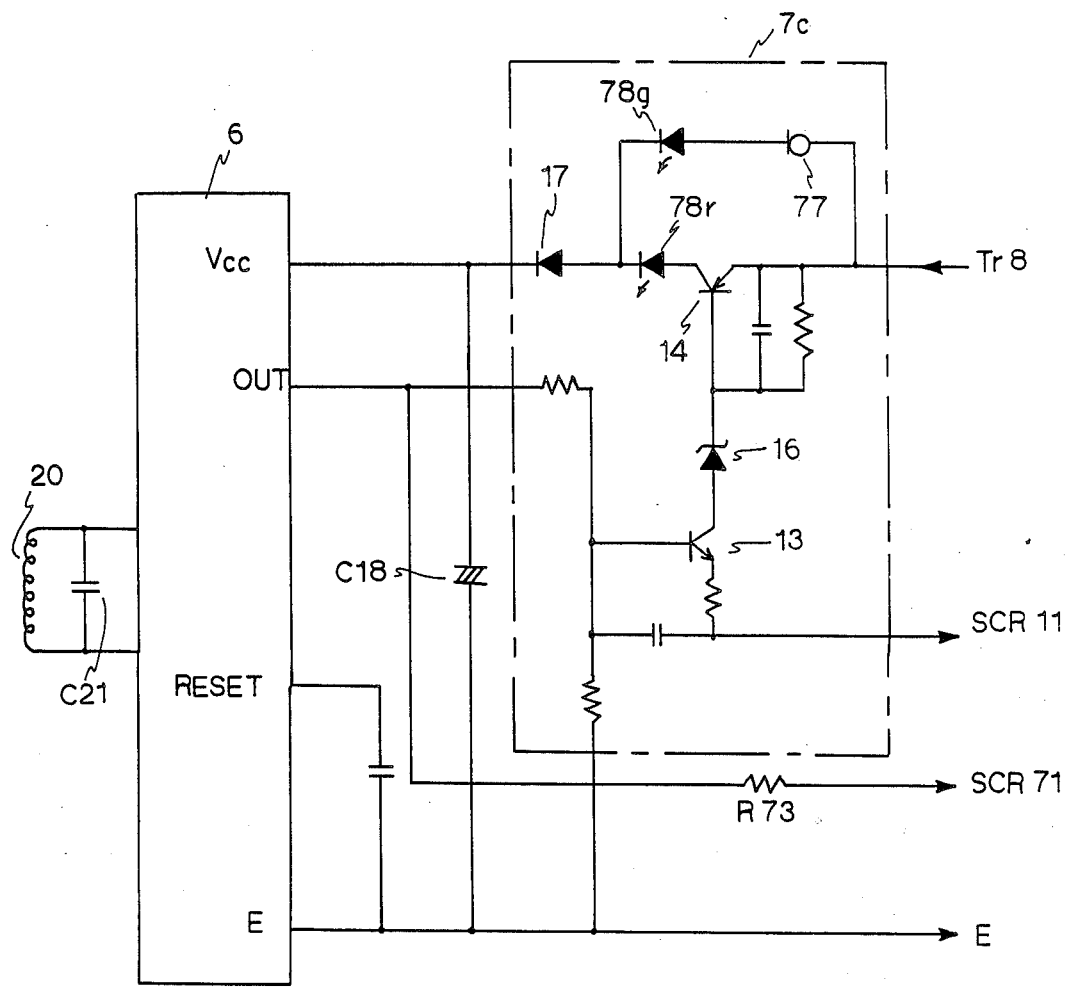
FIG. 11 shows a modification of the device of Fig. 9.

In FIG. 11, there is shown an electronic switching device modified from the device of FIG. 9 as a modification of the last mentioned embodiment. The device of FIG. 11 includes a modified trigger circuit 7c of the trigger circuit 7b of FIG. 9. The trigger circuit 7c of FIG. 11 includes a red-color operation display light emitting diode 78r, a constant current diode 77, a green-color power display light emitting diode 78g. WHen the device is connected with the external load 22 and the a.c. power source 23, the capacitor C18 is charged by a power generated from the voltage regulator circuit 5 through the diodes 77 and 78g, whereby the green color LED 78g is activated to display a power-on mode. WHen the circuit 6 detects an object, the thyristor 11 is triggered through transistor 13 to drive the load 22. In every zero cross points, the capacitor C18 is charged so as to energize the red-color LED 78r for displaying a detection mode of the device. The other operations are already explained in the foregoing embodiments, and omitted herein.

It should be understood that above description is merely illustrative of this invention, that the electronic switching device of the invention may be modified to a three wire type or a d.c. power source type, and that many other changes and modifications may be mode by those skilled in the art without departing from the scope of the appended claims.

What is claimed is:

1. An electronic switching device including means for controlling the flow of current from an external source through an external load, comprising:

input means rendered operable by a voltage produced by said external source and load and for producing an operating signal responsive to a predetermined external condition, power switching means in a series circuit with said external source and said external load and connected to receive said output signal from said input means for switching current flow through said series circuit responsive to said output signal, current detecting means coupled to said power switching means for detecting abnormally large currents flowing through said power switching means and for producing a limiting signal responsive to the appearance of an abnormally large current equal to or greater than a predetermined value, current limiting means connected in series with said power switching means for interrupting the current flow therethrough, said current limiting means being coupled to said current detecting means whereby said current limiting means is operated responsive to the appearance of said limiting signal and holding circuit means coupled to said current limiting means for maintaining the current limiting means in an operative state for interrupting flow through said power switching means for a predetermined period of operation of said electronic switching device.

2. The electronic switching device defined in claim 1 further comprising voltage regulating means supplying said input means with a regulated power voltage from said external source and load.

3. The electronic switching device defined in claim 1 wherein said current limiting means is a field effect transistor, the gate of which is coupled to said current detecting means, said current detecting means producing a limiting signal capable of rendering said field effect transistor nonconductive.

4. The electronic switching device defined in claim 3 wherein said power switching means is a first thyristor having a gate thereof coupled to said input means for receiving the output signal from said input means to thereby render said first thyristor conductive.

5. The electronic switching device defined in claim 4 wherein said current detecting means comprises a voltage divider for producing a divided output voltage proportional to the value of the current flowing through said power switching means and a second thyristor operated by said divided voltage to adjust the level of voltage appearing at the gate of said field effect transistor to switch said field effect transistor from conductive to nonconductive states.

6. The electronic switching device defined in claim 1 wherein said holding circuit means comprises compacitor means connected across the power input to said input means and resistance means coupling said capacitor to said current limiting means for maintaining the operability of said current limiting means in the absence of current flow through said power switching means.

7. The electronic switching device defined in claim 6 further comprising a display means connected in said holding circuit means for providing an indication when current flows through said holding circuit thereby indicating that the current flow through said power switching means has been interrupted.

* * * * *